United States Patent
Cheng et al.

(10) Patent No.: US 9,142,643 B2
(45) Date of Patent: Sep. 22, 2015

(54) METHOD FOR FORMING EPITAXIAL FEATURE

(71) Applicant: TAIWAN SEMICONDUCTOR MANUFACTURING COMPANY, LTD., Hsin-Chu (TW)

(72) Inventors: Yu-Hung Cheng, Hsinchu (TW); Tsz-Mei Kwok, Hsinchu (TW); Chun Hsiung Tsai, Xinpu Township, Hsinchu County (TW); Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 174 days.

(21) Appl. No.: 13/677,406

(22) Filed: Nov. 15, 2012

(65) Prior Publication Data

US 2014/0134818 A1    May 15, 2014

(51) Int. Cl.
*H01L 29/66* (2006.01)
*H01L 29/78* (2006.01)

(52) U.S. Cl.
CPC ...... *H01L 29/66636* (2013.01); *H01L 29/7834* (2013.01); *H01L 29/7848* (2013.01)

(58) Field of Classification Search
None
See application file for complete search history.

(56) References Cited

U.S. PATENT DOCUMENTS

| | | | | |
|---|---|---|---|---|
| 4,056,413 A * | 11/1977 | Yoshimura | | 438/418 |
| 6,342,421 B1 * | 1/2002 | Mitani et al. | | 438/300 |
| 7,172,957 B2 * | 2/2007 | Namba et al. | | 438/607 |
| 7,611,951 B2 * | 11/2009 | Ueno et al. | | 438/300 |
| 2005/0148162 A1 * | 7/2005 | Chen et al. | | 438/503 |
| 2005/0202665 A1 * | 9/2005 | Namba et al. | | 438/607 |
| 2007/0006800 A1 * | 1/2007 | Lee et al. | | 117/95 |
| 2007/0134879 A1 * | 6/2007 | Kim et al. | | 438/300 |
| 2008/0135894 A1 * | 6/2008 | Bohr et al. | | 257/288 |
| 2009/0065047 A1 * | 3/2009 | Fiorenza et al. | | 136/255 |
| 2011/0117732 A1 * | 5/2011 | Bauer et al. | | 438/507 |
| 2011/0287600 A1 | 11/2011 | Cheng et al. | | |
| 2012/0211803 A1 * | 8/2012 | Wu et al. | | 257/200 |
| 2013/0115742 A1 * | 5/2013 | Kim et al. | | 438/198 |

OTHER PUBLICATIONS

Tsung-Yang Liow et al., "Strained N-Channel FinFETs with 25nm Gate Length and Silicon-Carbon Source/Drain Regions for Performance Enhancement", 2006 Symposium on VLSI Technology Digest of Technical Papers, 2 pages.

* cited by examiner

*Primary Examiner* — Seahvosh Nikmanesh
(74) *Attorney, Agent, or Firm* — Haynes and Boone, LLP (57) ABSTRACT

The present disclosure provides an integrated circuit device and method for manufacturing the integrated circuit device. The disclosed method provides substantially defect free epitaxial features. An exemplary method includes forming a gate structure over the substrate; forming recesses in the substrate such that the gate structure interposes the recesses; and forming source/drain epitaxial features in the recesses. Forming the source/drain epitaxial features includes performing a selective epitaxial growth process to form an epitaxial layer in the recesses, and performing a selective etch back process to remove a dislocation area from the epitaxial layer.

20 Claims, 7 Drawing Sheets

METHOD FOR FORMING EPITAXIAL FEATURE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain features for an n-type device, and epitaxially grows silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
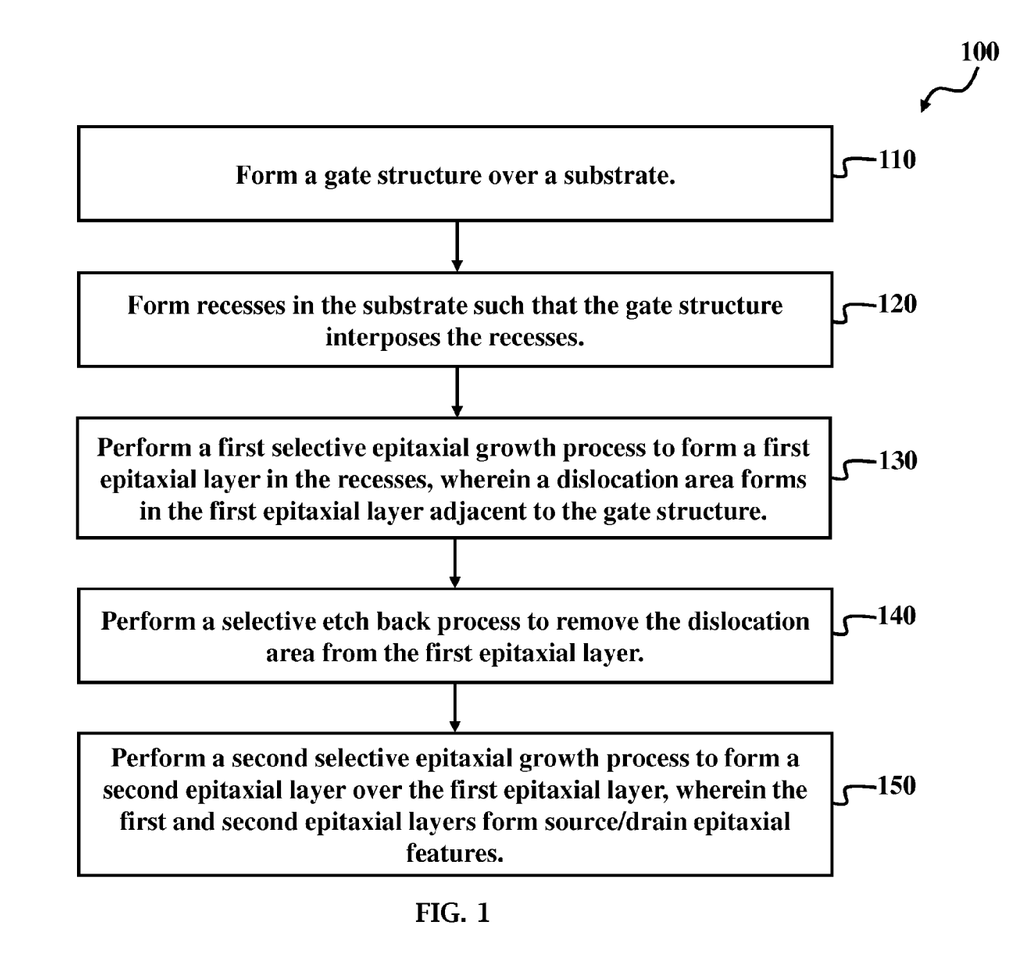
FIG. 1 is a flow chart of a method for fabricating an integrated circuit device according to various aspects of the present disclosure.

FIG. 1 is a flow chart of a method 100 for fabricating an integrated circuit device according to various aspects of the present disclosure. In particular, the method 100 provides the integrated circuit device with dislocation-free source/drain epitaxial features. The method 100 begins at block 110 where a gate structure is formed over a substrate. At block 120, recesses are formed in the substrate, such that the gate structure interposes the recesses. At block 130, a first selective epitaxial growth process is performed to form a first epitaxial layer in the recesses. A dislocation area forms adjacent to the gate structure in the first epitaxial layer during the first selective epitaxial growth process. At block 140, a selective etch back process is performed to remove the dislocation area from the first epitaxial layer. At block 150, a second epitaxial growth process is performed to form a second epitaxial layer over the first epitaxial layer. The first epitaxial layer and the second epitaxial layer combine to form source/drain epitaxial features. The method 100 may continue for to complete fabrication of the integrated circuit device. Additional steps can be provided before, during, and after the method 100, and some of the steps described can be replaced or eliminated for additional embodiments of the method 100. The discussion that follows illustrates an embodiment of an integrated circuit device that can be fabricated according to the method 100 of FIG. 1.

FIGS. 2-7 are various diagrammatic cross-sectional views of an integrated circuit device 200 during various fabrication stages according to the method 100 of FIG. 1. FIGS. 2-7 have been simplified for the sake of clarity to better understand the inventive concepts of the present disclosure. In the depicted embodiment, the integrated circuit device 200 includes a field effect transistor device 205, specifically an n-channel field effect transistor (NFET). Alternatively, the field effect transistor is a p-channel field effect transistor (PFET). The integrated circuit device 200 can further include memory cells and/or logic circuits; passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
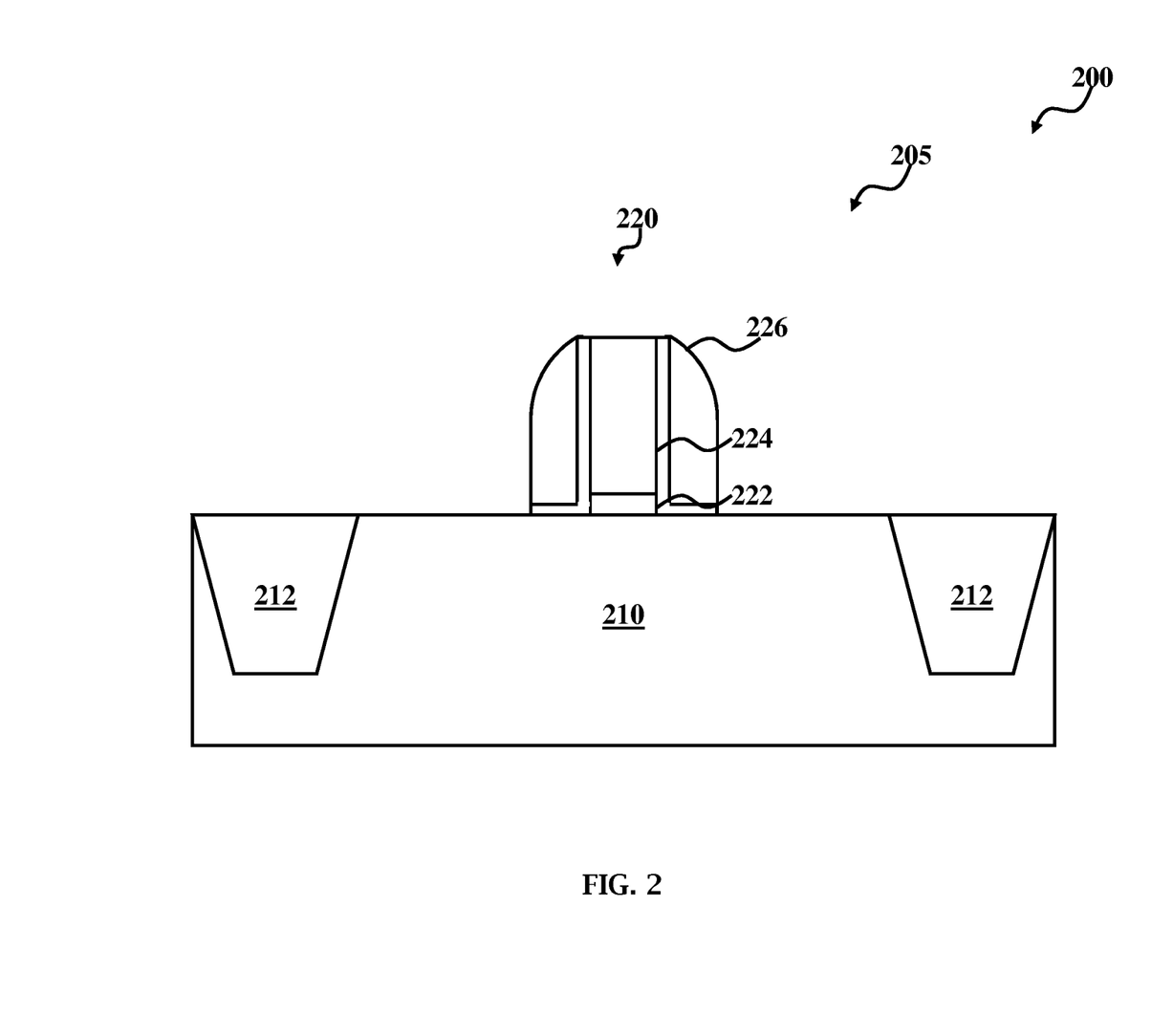
FIGS. 2-7 are various diagrammatic cross-sectional views of an embodiment of an integrated circuit device during various fabrication stages according to the method of FIG. 1.

In FIG. 2, a substrate 210 is provided. In the depicted embodiment, the substrate 210 is a semiconductor substrate including silicon. The substrate may be a p-type or n-type substrate. Alternatively, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, the substrate 210 may include a doped epi layer, a gradient semiconductor layer, and/or a semiconductor layer overlying another semiconductor layer of a different type, such as a silicon layer on a silicon germanium layer. The substrate 210 includes various doped regions (such as various p-type wells or n-type wells) depending on design requirements of the integrated circuit device 200. The doped regions may be doped with p-type dopants, such as boron or $BF_2$;

n-type dopants, such as phosphorus or arsenic; or a combination thereof. For example, the substrate 210 includes a doped region configured for the field effect transistor device 205, such as doped regions configured for the NFET in the depicted embodiment.

Isolation feature 212 is disposed in the substrate 210 to isolate various regions of the substrate 210. For example, the isolation feature 212 isolates the field effect transistor device 205 from other devices (not shown) of the integrated circuit device 200. The isolation feature 212 utilizes isolation technology, such as local oxidation of silicon (LOCOS) and/or shallow trench isolation (STI), to define and electrically isolate the various regions. The isolation feature 212 includes silicon oxide, silicon nitride, silicon oxynitride, other suitable material, or combinations thereof. In the depicted embodiment, the isolation feature 212 is a shallow trench isolation feature (STI) that includes an oxide material, such as silicon oxide. The isolation feature 212 is formed by a suitable process. For example, forming the STI feature includes using a lithography process to expose a portion of the substrate 210, etching a trench in the exposed portion of the substrate 210 (for example, by a dry etching process, wet etching process, or combination thereof), and filling the trench (for example, by a chemical vapor deposition process) with one or more dielectric materials. In an example, the filled trench has a multilayer structure, such as a thermal oxide liner layer filled with silicon nitride or silicon oxide.

A gate structure 220 is formed over the substrate 210. In the depicted embodiment, the gate structure 220 includes a gate stack that includes a gate dielectric layer 222 and a gate electrode layer 224. The gate stack may include numerous other layers (such as capping layers, diffusion layers, barrier layers, hard mask layers, or combinations thereof) depending on design requirements of the field effect transistor device 205. The gate stack of the gate structure 220 is formed by deposition processes, lithography processes, etching processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography processes include photoresist coating (for example, spin-on coating), soft baking, mask aligning, exposure, post-exposure baking, developing, rinsing, drying (for example, hard baking), other suitable processes, or combinations thereof. Alternatively, the lithography exposing process is implemented or replaced by other methods, such as maskless photolithography, electron-beam writing, or ion-beam writing. The etching processes include dry etching, wet etching, other etching methods, or combinations thereof.

The gate dielectric layer 222 is formed over the substrate 210 and includes a dielectric material, such as silicon oxide, silicon oxynitride, silicon nitride, a high-k dielectric material, or combinations thereof. In the depicted embodiment, the gate dielectric layer 222 includes a high-k dielectric material. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$—$Al_2O_3$) alloy, hafnium aluminum oxide (HfAlO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric layer 222 may include a multilayer structure. For example, the gate dielectric layer 222 may include an interfacial layer formed over the substrate 210, and a high-k dielectric layer formed over the interfacial layer. The interfacial layer may be a silicon oxide layer formed by a thermal process or ALD process.

The gate electrode layer 224 is disposed over the gate dielectric layer 222. The gate electrode layer 224 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode layer 124 may be doped or undoped depending on design requirements of the field effect transistor device 205. In the depicted embodiment, the gate electrode layer 224 includes a work function layer tuned to have a proper work function for enhanced performance of the field effect transistor device 205. For example, in the depicted embodiment, where the field effect transistor device 205 is the NFET, the work function layer includes an n-type work function metal (n-metal), such as Ta, TiAl, TiAlN, TaCN, other n-type work function metal, or a combination thereof. Where the field effect transistor device 205 is a PFET, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 224 includes a work function layer disposed over the gate dielectric layer 222 and a conductive layer disposed over the work function layer.

The gate structure 220 further includes gate spacers 226 positioned along sidewalls of the gate stack (specifically along sidewalls of the gate dielectric layer 222 and the gate electrode layer 224). The gate spacers 226 include a dielectric material, such as silicon oxide, silicon nitride, silicon oxynitride, other dielectric material, or combination thereof. In an example, the gate spacers 226 are formed by blanket depositing a first dielectric layer (a silicon oxide layer) over the integrated circuit device 200 and a second dielectric layer (a silicon nitride layer) over the first dielectric layer, and then, anisotropically etching to remove portions of the dielectric layers to form the gate spacers 226 as illustrated in FIG. 2.

Figure 3:
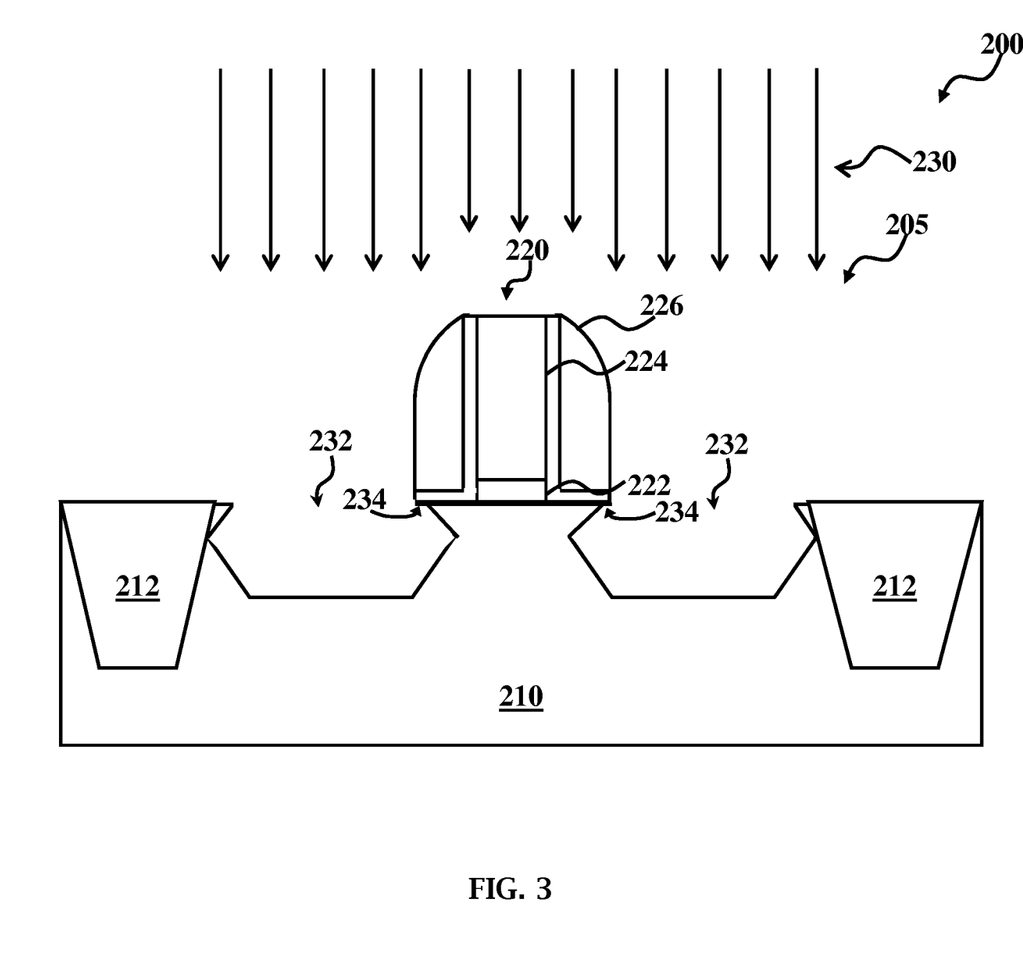

In FIG. 3, an etching process 230 removes portions of the substrate 210 at either side of the gate structure 220 to form recesses 232 in the substrate 210. In the depicted embodiment, the recesses 232 are formed in a source region and a drain region of the field effect transistor device 205, such that the gate structure 220 interposes the recesses 232. The etching process 230 includes a dry etching process, a wet etching process, or a combination thereof. The etching process 230 is controlled to achieve a desired profile of the recesses 232. For example, etching parameters of the dry and wet etching processes can be tuned (such as etchants used, etching temperature, etching solution concentration, etching pressure, source power, RF bias voltage, RF bias power, etchant flow rate, and other suitable parameters) to achieve the desired recess profile. The dry etching process may use chlorine-containing gases, fluorine-containing gases, other etching gases, or a combination thereof. The wet etching solutions may include $NH_4OH$, HF (hydrofluoric acid), TMAH (tetramethylammonium hydroxide), other suitable wet etching solutions, or combinations thereof. After the etching process 230, a precleaning process may be performed that clean the recesses 232 with a hydrofluoric acid (HF) solution or other suitable solution. By etching the substrate 210 to form the recesses 232, the etching process 230 exposes corners 234 of the gate structure 220.

Figure 4:
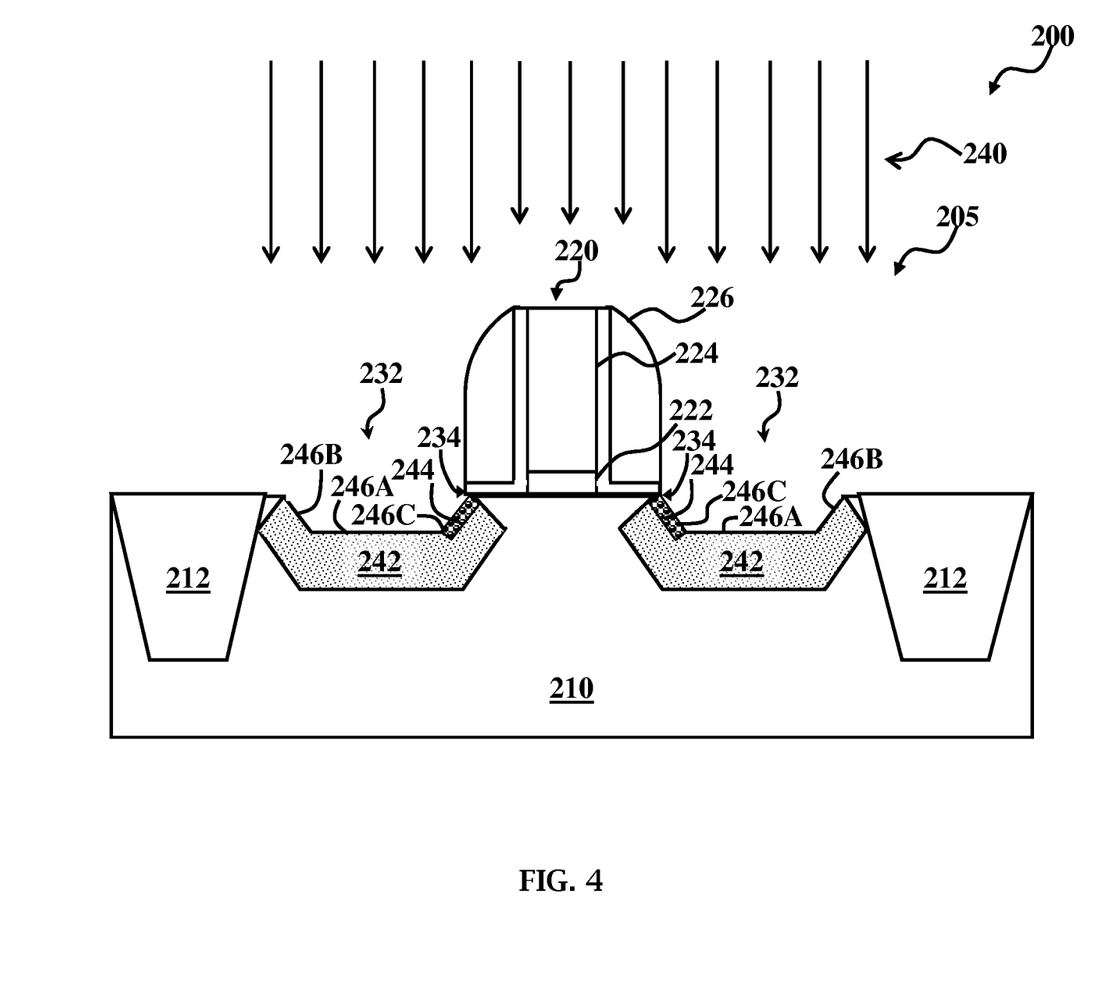
Figure 5:
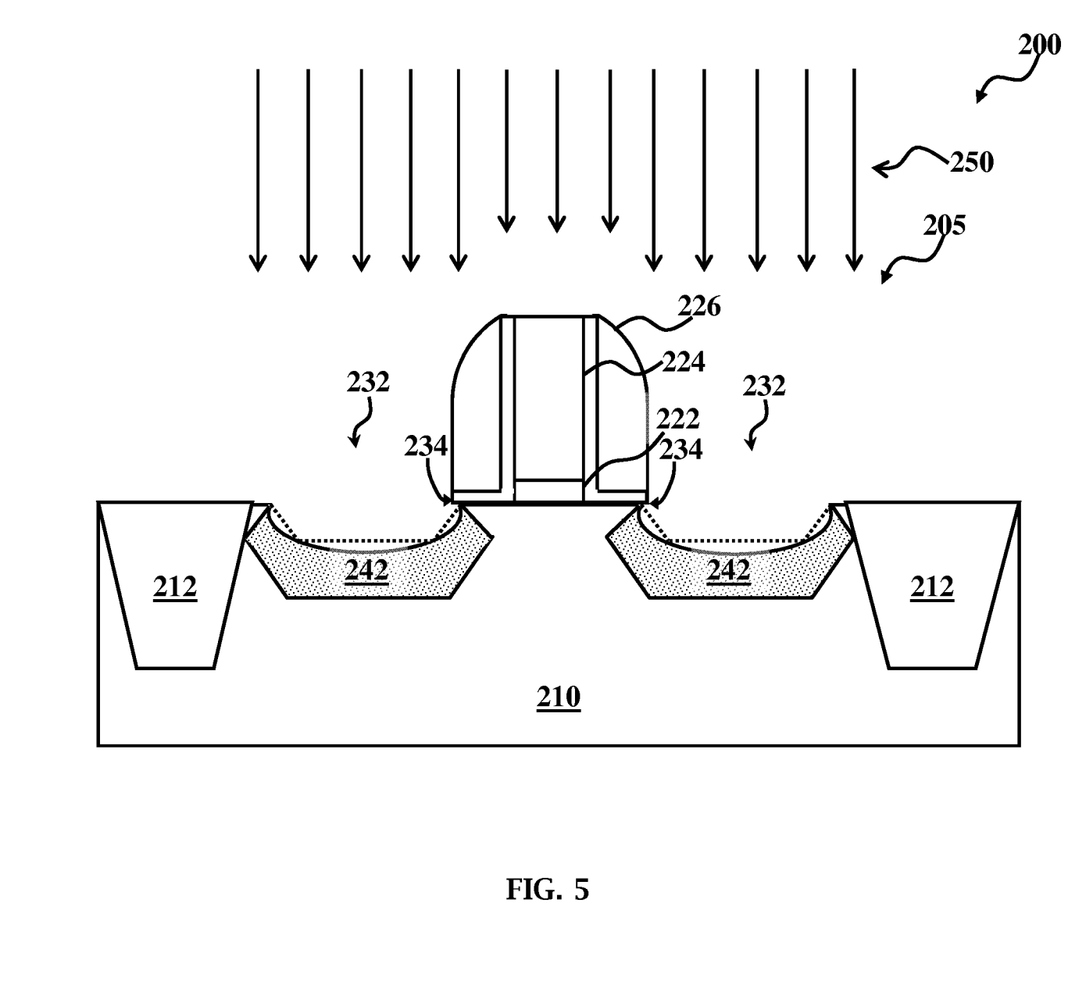
Figure 6:
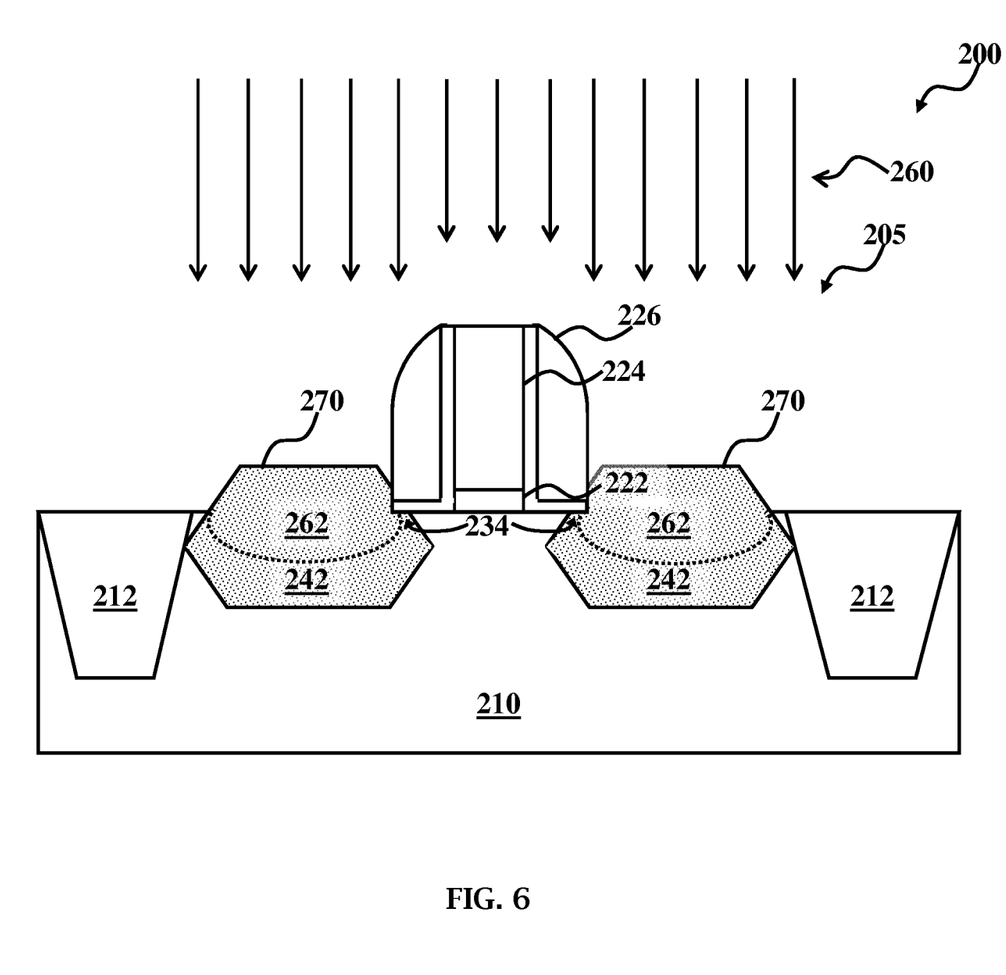

Accordingly, in FIGS. 4-6, the present disclosure provides a method for forming dislocation-free source/drain epitaxial features, particularly dislocation-free source/drain epitaxial features adjacent to the corners 234 of the gate structure 220. In FIG. 4, a selective epitaxial growth (SEG) process 240 is performed to form an epitaxial layer 242 in the recesses 232. In the present example, the SEG process 240 is a low pressure chemical vapor deposition (LPCVD) process. The SEG process 240 uses a silicon-based precursor gas to form the epitaxial layer 242. Exemplary silicon-based precursor gases include silane ($SiH_4$), dicholorosilane (DCS), disilane ($Si_2H_6$), trisilane ($Si_3H_8$), other silicon-based precursor gases, or combinations thereof. Further, in the present example, the SEG process 240 in-situ dopes the epitaxial layer 242. For example, the SEG process 240 introduces n-type dopants using phosphorous-containing gases such as phosphine ($PH_3$), arsenic-containing gases such as arsine ($AsH_3$), carbon-containing gases such as monomethylsilane (MMS), other n-type dopant-containing gases, or a combination thereof. In one embodiment, the SEG process 240 uses HCl. The SEG process 240 achieves a net-grown by using LPCVD with both deposition and etching at the same time. In this embodiment, a deposition gas such as DCS is used to provide a source of Si, while an etching gas such as HCl is used to control selective grown between Si opening areas and dielectric surfaces. In other embodiments, deposition and etching processes are separately and independently performed in separate processing steps. For example, a deposition process performs non-selective grown of a Si film on both the Si open areas and the dielectric surfaces, then the following etching steps tries to remove the Si film from the dielectric surfaces to maintain selectivity.

In the depicted embodiment, the SEG process 240 uses a silicon-based precursor gas, a phosphorous-containing gas such as phosphine ($PH_3$), and a carbon-containing gas such as monomethylsilane (MMS), such that the epitaxial layer 242 is a Si:CP (silicon doped with phosphorous and carbon) layer. In an example, the silicon-based precursor gas is introduced into a chamber at flow rate of about 50 sccm to about 500 sccm, the $PH_3$ gas is introduced into the chamber at a flow rate of about 10 sccm to about 50 sccm, and the MMS is introduced into the chamber at a flow rate of about 5 sccm to about 50 sccm. Deposition time of SEG SiCP layer is ~60 sec to ~1200 sec. Alternatively, where the field effect transistor device 205 is a PFET, the SEG process 240 introduces p-type dopants using boron-containing gases such as diborane ($B_2H_6$), other p-type dopant-containing gases, or a combination thereof. If the epitaxial layer 242 is not doped during the SEG process 240, it may be doped in a subsequent process, for example, by an ion implantation process, plasma immersion ion implantation (PIII) process, gas and/or solid source diffusion process, other process, or a combination thereof. An annealing process, such as a rapid thermal annealing and/or a laser thermal annealing, may be performed to activate dopants in the epitaxial layer 242. Other process parameters of the SEG process 240 can be tuned to form the epitaxial layer 242. For example, a temperature of the substrate during the SEG process 240 is about 500° C. to about 700° C. As another example, a pressure of the chamber during the SEG process 240 is about 10 torr to about 600 torr. As noted above, in the present example, the SEG process 240 is a LPCVD process. Alternatively, the SEG process 240 implements other CVD processes (such as ultra-high vacuum CVD (UHV-CVD)), molecular beam epitaxy, other selective epitaxial growth processes, or a combination thereof.

The epitaxial layer 242 selectively grows on surfaces of the substrate 210 that define the recesses 232, such that the recesses 232 are partially filled by the epitaxial layer 242. In the depicted embodiment, the SEG process 240 is performed until the epitaxial layer 242 reaches a critical thickness, such that a dislocation area 244 is formed in the epitaxial layer 242 adjacent to the gate structure 220. The dislocation area 244 is formed at the corners 234 of the gate structure 220, particularly at an interface of the gate spacers 226 (dielectric portions) and the epitaxial layer 242. The dislocation area 244 forms in the epitaxial layer 242 at the corners 234 of the gate structure 220. This can be due, at least in part, to non-perfect crystal grown near the dielectric surfaces, and dislocations or defects would readily form at the interface between the epitaxy film and the dielectric surface. The epitaxial layer 242 has various surfaces that conform to sidewalls of the recesses 232. In the depicted embodiment, the epitaxial layer 242 has various facets (also referred to as surfaces) 246A, 246B, and 246C. The facet 246A is substantially parallel with a bottom surface of the recess 232, and in the depicted embodiment, the facet 246A is in a <100> crystallographic plane. The facets 246B and 246C are substantially parallel with sidewall surfaces of the recesses 232, and in the depicted embodiment, the facets 246B and 246C are in a <111> crystallographic plane.

In FIG. 5, an etch back process 250 is performed to remove portions of the epitaxial layer 242. More specifically, the etch back process 250 selectively etches the epitaxial layer 242 to remove the dislocation area 244. In the depicted embodiment, the etch back process 250 removes the dislocation area 244 in the epitaxial layer 242 by removing the <111> crystallographic planes of the epitaxial layer 242 (here, the facets 246B and 246C). The etch back process 250 thus modifies a profile of the epitaxial layer 242. The etch back process 250 includes a dry etching process, a wet etching process, or combination thereof. In other embodiments, an ex-situ etch process (e.g., a wet etch or RF plasma) can be used to remove any dislocations.

The etch back process 250 is controlled and tuned to ensure removal of the dislocation area 244 of the epitaxial layer 242. For example, etching parameters of the dry and wet etching processes can be tuned (such as etchants used, etching temperature, etching solution concentration, etching pressure, source power, RF bias voltage, RF bias power, etchant flow rate, and other suitable parameters) to remove the dislocation area 244. In the depicted embodiment, the etch back process 250 is a dry etching process that uses a chlorine-containing gas (such as HCl, $Cl_2$, other chlorine-containing gases, or a combination thereof) and a germane-containing gas (such as $GeH_4$, $GeCH_3$, other germane-containing gases, or a combination thereof). The dry etching process may also use a fluorine-containing gas (such as HF, $NF_3$, $SF_6$, $CF_4$, other fluorine-containing gases, or combinations thereof), a silicon-containing gas (such as DCS, $SiCH_3$, other silicon-containing gas, or a combination thereof), other gas, or a combination thereof. In the present example, the etch back process 250 uses a gas mixture of HCl and $GeH_4$. For example, the HCl gas is introduced into the chamber at a flow rate of about 100 sccm to about 1000 sccm, and the $GeH_4$ gas (1 at % GeH4 with H2 mixture) is introduced into the chamber at a flow rate of about 100 sccm to about 500 sccm. In another example, the etch back process 250 uses a gas mixture of HCl, $GeH_4$, and DCS. For example, the HCl gas is introduced into a chamber at a flow rate of about 100 sccm to about 1000 sccm, the $GeH_4$ gas (1 at % GeH4 with H2 mixture) is introduced into the chamber at a flow rate of about 100 sccm to about 500 sccm, and the DCS is introduced into the chamber at a flow rate of about 10 sccm to about 300 sccm. Etching time of etch-back step is ~10 sec to ~180 sec. Other process parameters of the etch back process 250 can be tuned to etch back the epitaxial layer 242. For example, a temperature of the substrate during the etch back process 250 is about 500° C. to about 700° C. As another example, a pressure of the chamber during the etch back process 250 is about 10 torr to about 600 torr. In the present embodiment, the SEG and etch-back process are performed at the same temperature and pressure.

In FIG. 6, a SEG process 260 is performed to form an epitaxial layer 262 in the recesses 232 over the epitaxial layer 242, such that the epitaxial layer 262 and the epitaxial layer 242 combine to fill the recesses 232 and form source/drain epitaxial features 270. In the present example, the SEG process 260 is a low pressure chemical vapor deposition (LPCVD) process. The SEG process 260 uses a silicon-based precursor gas to form the epitaxial layer 262. Exemplary silicon-based precursor gases include silane ($SiH_4$), dicholorosilane (DCS), disilane ($Si_2H_6$), trisilane ($Si_3H_8$), other silicon-based precursor gases, or combinations thereof. Further, in the present example, the SEG process 260 in-situ dopes the epitaxial layer 262. For example, the SEG process 260 introduces n-type dopants using phosphorous-containing gases such as phosphine ($PH_3$), arsenic-containing gases such as arsine ($AsH_3$), carbon-containing gases such as monomethylsilane (MMS), other n-type dopant-containing gases, or a combination thereof. In the depicted embodiment, the SEG process 260 uses a silicon-based precursor gas and a phosphorous-containing gas such as phosphine ($PH_3$), such that the epitaxial layer 262 is a Si:P (silicon doped with phosphorous) layer. In an example, the silicon-based precursor gas (DCS) is introduced into the chamber at a flow rate of about 100 sccm to about 500 sccm and the $PH_3$ gas is introduced into the chamber at a flow rate of about 10 sccm to about 50 sccm. Deposition time of SEG SiP layer is ~60 sec to ~1200 sec. Alternatively, where the field effect transistor device 205 is a PFET, the SEG process 260 introduces p-type dopants using boron-containing gases such as diborane ($B_2H_6$), other p-type dopant-containing gases, or a combination thereof. If the epitaxial layer 262 is not doped during the SEG process 260, it may be doped in a subsequent process, for example, by an ion implantation process, plasma immersion ion implantation (PIII) process, gas and/or solid source diffusion process, other process, or combinations thereof. An annealing process, such as a rapid thermal annealing and/or a laser thermal annealing, may be performed to activate dopants in the epitaxial layer 262. Other process parameters of the SEG process 260 can be tuned to form the epitaxial layer 262. For example, a temperature of the substrate during the SEG process 260 is about 500° C. to about 700° C. As another example, a pressure of the chamber during the SEG process 260 is about 10 torr to about 600 torr. As noted above, in the present example, the SEG process 260 is a LPCVD process. Alternatively, the SEG process 260 implements other CVD processes (such as ultra-high vacuum CVD (UHV-CVD), molecular beam epitaxy, other selective epitaxial growth processes, or a combination thereof.

Because the dislocation area 244 in the epitaxial layer 242 was removed by the etch back process 250 (FIG. 5), the source/drain epitaxial features 270 are dislocation free, particularly dislocation free at the corners 234 of the gate structure 220. The field effect transistor device 205, having the dislocation free source/drain epitaxial features 270 formed by the SEG/etch back/SEG method described herein, thus exhibits significant device performance improvement over field effect transistor devices having source/drain epitaxial features formed without the etch back process. For example, the field effect transistor device 205 exhibits reduced series parasitic source-drain resistance ($R_{SD}$), drain induced barrier lowering (DIBL), and off-state leakage current ($I_{OFF}$). In a specific example, the field effect transistor device 205 exhibits an 11% improvement in on-state current ($I_{ON}$) when compared to field effect transistor devices formed by conventional selective epitaxial growth processes that do not implement the disclosed etch back process.

In the depicted embodiment, the SEG process 240, the etch back process 250, and the SEG process 260 are performed in situ (in other words, SEG process 240, etch back process 250, and SEG process 260 are performed in a same process chamber). In an example, there is no vacuum break between the SEG process 240, etch back process 250, and SEG process 260. Accordingly, transition from the SEG process 240 to the etch back process 250 to the SEG process 260 may be performed by adjusting process conditions such as the compositions, flow rates, and pressures of process gases and temperature of the substrate.

Further, the disclosed SEG/etch back/SEG process for forming the dislocation-free source/drain epitaxial features 270 is easily implemented into current processing. Though cyclical deposition/etch processes can achieve dislocation-free source/drain epitaxial features, such processes are complex and time-consuming for mass production of integrated circuit devices when compared to the disclosed SEG/etch back/SEG process. Several advantages for one or more of the above-described embodiments are achieved. For example, the present process uses a relatively long deposition time with better-selective epitaxy growth instead of short pulse deposition time and worse-selective growth in conventional processes. Also, conventional processing tries to remove both amorpous or polycrystalline films on silicon and dielectrics surfaces, while the etch-back process in the present disclosure specifically removes defects or dislocations on gate corner area. Different embodiments may have different advantages, and no particular advantage is necessarily required of any embodiment.

Figure 7:
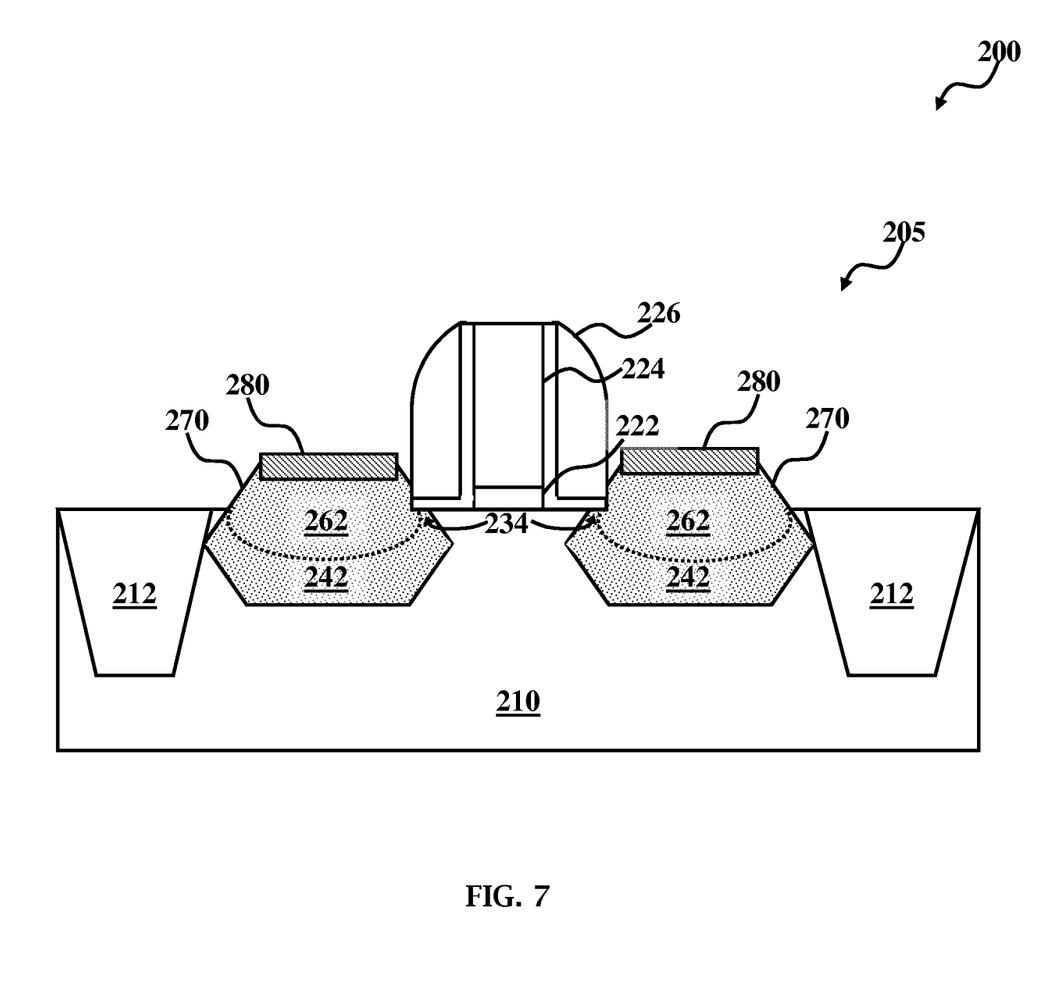

In FIG. 7, conductive features 280 are formed on the source/drain epitaxial features 270. In the present example, the conductive features 280 are metal silicide features, such as nickel silicide features. In an example, the metal silicide features are formed on the source/drain epitaxial features 270 by depositing a metal layer over the source/drain epitaxial features 270, annealing the metal layer such that the metal layer reacts with silicon in the source/drain epitaxial features to form the metal silicide features, and removing the non-reacted metal layer. The integrated circuit device 200 may undergo additional processing as discussed briefly below. For example, lightly doped source/drain (LDD) and/or heavily doped source/drain (HDD) regions for the field effect transistor device may be formed by ion implantation of n-type dopants and/or p-type dopants. The LDD and/or HDD regions may be formed earlier than in the depicted embodiment. In an example, an inter-level dielectric (ILD) layer is formed over the substrate and a chemical mechanical polishing (CMP) process is further applied to the substrate to planarize the substrate. Further, a contact etch stop layer (CESL) may be formed over the gate structure 220 before forming the ILD layer. In an embodiment, the gate electrode layer remains polysilicon. In another embodiment, the polysilicon is removed and replaced with a metal in a gate last or gate replacement process. In a gate last process, the CMP process on the ILD layer is continued to expose the polysilicon of the gate structure, and an etching process is performed to remove the poly, thereby forming trenches. The trenches are filled with a proper work function metal (e.g., p-type work function metal and n-type work function metal) for the PFET devices and the NFET devices. Further, a multilayer interconnection (MLI) including metal layers and inter-metal dielectric (IMD) layers is formed over the substrate 210 to electrically connect various features or structures of the integrated circuit device 200. The multilayer interconnection includes vertical interconnects, such as vias or contacts, and horizontal interconnects, such as conductive lines. The various interconnection features may implement various conductive materials including copper, tungsten, and silicide. In one example, a damascene process or a dual damascene process forms a copper multilayer interconnection structure.

In the depicted embodiment, the source/drain epitaxial features 270 are formed for a planar device, specifically the field effect transistor device 200. The method for forming the source/drain epitaxial features 270 equally applies to forming source/drain epitaxial features for fin field-effect transistors (FinFETs). For example, the method may include forming the gate structure on a fin (not shown) (for example, a silicon fin disposed over the substrate), etching exposed portions of the fin that are not covered by the gate structure, and performing the selective epitaxial growth and selective etch back process described herein to form epitaxial features on the exposed portions of the fin. Further, the process details described herein may be used for forming epitaxial features in other CMOS devices, solar cells, micro-electro-mechanical-systems (MEMS) devices, and other types of devices.

The present disclosure provides for various embodiments. An exemplary method includes forming a gate structure over a substrate; forming recesses in the substrate such that the gate structure interposes the recesses; and forming source/drain epitaxial features in the recesses. Forming the source/drain epitaxial features includes performing a selective epitaxial growth process to form an epitaxial layer in the recesses, wherein a dislocation area forms in the epitaxial layer during the selective epitaxial growth process; and performing a selective etch back process to remove the dislocation area. In an example, performing the selective epitaxial growth process to form the epitaxial layer includes forming a first epitaxial layer with a first selective epitaxial growth process, wherein the first epitaxial layer includes the dislocation area, the dislocation area being adjacent to the gate structure; and after the selective etch back process, forming a second epitaxial layer over the first epitaxial layer with a second selective epitaxial growth process. The dislocation area is at an interface between the first epitaxial layer and a corner of the gate structure. In an example, the dislocation area is a <111> facet of the first epitaxial layer adjacent to the gate structure. In an example, the selective epitaxial growth process uses a silicon-based precursor gas and a dopant gas, and the selective etch back process uses a gas including a hydrogen chloride (HCl) gas and a germane (GeH$_4$) gas. Exemplary silicon-based precursor gases include silane (SiH$_4$), dichlorosilane (DCS), disilane (Si$_2$H$_6$), trisilane (Si$_3$H$_8$), and a combination thereof. Exemplary dopant gases include phosphine (PH$_3$), arsine (AsH$_3$), monomethylsilane (MMS), or combination thereof. The selective etch back process may further use a dichlorosilane (DCS) gas. In an example, the selective epitaxial growth process is a low pressure chemical vapor deposition. In an example, the selective epitaxial growth process and the selective etch back process are performed in situ.

Another exemplary method includes forming a gate structure over the substrate; forming a recess in the substrate adjacent to the gate structure; forming a first epitaxial layer in the recess, wherein the first epitaxial layer has a defect area adjacent to the gate structure; removing the defect area from the first epitaxial layer; and forming a second epitaxial layer in the recess over the first epitaxial layer. The first epitaxial layer is formed by a first selective epitaxial growth process that uses a silicon-based precursor gas and a first dopant gas; and the second epitaxial layer is formed by a second selective epitaxial growth process that uses the silicon-based precursor gas and a second dopant gas. In an example, silicon-based precursor gases includes one of silane (SiH$_4$), dichlorosilane (DCS), disilane (Si$_2$H$_6$), trisilane (Si$_3$H$_8$), and a combination thereof; the first dopant gas includes phosphine (PH$_3$) and monomethylsilane (MMS); and the second dopant gas includes phosphine (PH$_3$). The defect area is removed by a selective etch back process that uses a gas including a hydrogen chloride (HCl) gas and a germane (GeH$_4$) gas. The selective etch back process may further use a dichlorosilane (DCS) gas. In an example, the defect area is located at an interface between the first epitaxial layer and a corner of the gate structure.

Yet another exemplary method includes forming a gate structure over the substrate; forming recesses in the substrate such that the gate structure interposes the recesses; and forming source/drain epitaxial features in the recesses. Forming the source/drain epitaxial features includes performing a first selective epitaxial growth process to form a first epitaxial layer that partially fills the recesses, wherein a portion of the first epitaxial layer contacts a corner of the gate structure; performing a selective etch back process to the first epitaxial layer to remove a dislocation area associated with the portion of the first epitaxial layer contacting gate corner; and performing a second epitaxial growth process to form a second epitaxial layer over the first epitaxial layer that fills the recesses, wherein a portion of the second epitaxial layer contacts the corner of the gate structure. In an example, the selective etch back process removes a <111> facet of the first epitaxial layer. In an example, the corner of the gate structure includes a dielectric material and the first epitaxial layer and the second epitaxial layer include n-type doped silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate structure over a substrate;
    forming a dielectric isolation structure in the substrate;
    forming a sidewall spacer along a sidewall of the gate structure;
    forming a recess in the substrate adjacent the gate structure such that the recess extends directly under the sidewall spacer, wherein the recess has a first sidewall having a <111> crystallographic plane, a second sidewall having the <111> crystallographic plane, and a third sidewall having a <100> crystallographic plane that intersects the first and second sidewalls; and
    forming source/drain epitaxial features in the recesses, wherein the forming the source/drain epitaxial features includes:

performing a selective epitaxial growth process to form an epitaxial layer in the recesses directly on the first, second, and third sidewalls of the recess, wherein a dislocation area forms in the epitaxial layer during the selective epitaxial growth process directly under the sidewall spacer; and performing a selective etch back process to remove the dislocation area, wherein after performing the selective etch back process to remove the dislocation area a remaining portion of the epitaxial layer extends continuously from the sidewall spacer to the dielectric isolation structure along the first, second, and third sidewalls of the recess.

2. The method of claim 1, wherein the dislocation area is at an interface between the epitaxial layer and a corner of the gate structure.

3. The method of claim 2 wherein the dislocation area is a <111> facet of the epitaxial layer adjacent to the gate structure.

4. The method of claim 1 wherein:
the selective epitaxial growth process uses a silicon-based precursor gas; and
the selective etch back process uses a gas including a hydrogen chloride (HCl) gas and a germane ($GeH_4$) gas.

5. The method of claim 4 wherein the silicon-based precursor gas is one of silane ($SiH_4$), dicholorosilane (DCS), disilane ($Si_2H_6$), trisilane ($Si_3H_8$), and a combination thereof.

6. The method of claim 4 wherein the selective epitaxial growth process further uses a dopant gas.

7. The method of claim 6 wherein the dopant gas is one of phosphine ($PH_3$), arsine ($AsH_3$), monomethylsilane (MMS), or combination thereof.

8. The method of claim 4 wherein the selective etch back process further uses a dichlorosilane (DCS) gas as part of an etching/epitaxial grown gas mixture.

9. The method of claim 1 wherein performing the selective epitaxial growth process includes performing a low pressure chemical vapor deposition.

10. A method comprising:
forming a gate structure over the substrate;
forming an isolation structure in the substrate;
forming a sidewall spacer along a sidewall of the gate structure;
forming a recess in the substrate adjacent to the gate structure, wherein the recess has a first sidewall having a <111> crystallographic plane, a second sidewall having the <111> crystallographic plane, and a third sidewall having a <100> crystallographic plane that intersects the first and second sidewalls;
forming a first epitaxial layer in the recess directly on the first, second, and third sidewalls of the recess, wherein the first epitaxial layer has a defect area adjacent to the gate structure;
removing the defect area from the first epitaxial layer, wherein after removing the defect area from the first epitaxial layer a remaining portion of the first epitaxial layer is positioned directly under the sidewall spacer, wherein the remaining portion of the first epitaxial layer continuously extends from the sidewall spacer to the isolation structure along the first, second, and third sidewalls of the recess; and
forming a second epitaxial layer in the recess over the first epitaxial layer.

11. The method of claim 10 wherein:
the forming the first epitaxial layer includes performing a first selective epitaxial growth process that uses a silicon-based precursor gas and a first dopant gas; and
the forming the second epitaxial layer includes performing a second selective epitaxial growth process that uses the silicon-based precursor gas and a second dopant gas.

12. The method of claim 11 wherein:
the silicon-based precursor gas includes one of silane ($SiH_4$), dicholorosilane (DCS), disilane ($Si_2H_6$), trisilane ($Si_3H_8$), and a combination thereof;
the first dopant gas includes phosphine ($PH_3$) and monomethylsilane (MMS); and
the second dopant gas includes phosphine ($PH_3$).

13. The method of claim 10 wherein removing the defect area from the first epitaxial layer includes performing a selective etch back process that uses a gas including a hydrogen chloride (HCl) gas and a germane ($GeH_4$) gas.

14. The method of claim 13 wherein the selective etch back process further uses a dichlorosilane (DCS) gas.

15. The method of claim 10 wherein the defect area is located at an interface between the first epitaxial layer and a corner of the gate structure.

16. A method comprising:
forming a gate structure over the substrate;
forming a sidewall spacer along a sidewall of the gate structure;
forming an isolation structure in the substrate;
forming a recess in the substrate between the gate structure and the isolation structure, wherein the recess has a first sidewall having a <111> crystallographic plane, a second sidewall having the <111> crystallographic plane, and a third sidewall having a <100> crystallographic plane that intersects the first and second sidewalls; and
forming a source/drain epitaxial feature in the recess, wherein the forming the source/drain epitaxial feature includes:
performing a first selective epitaxial growth process to form a first epitaxial layer that partially fills the recess, wherein a portion of the first epitaxial layer contacts a corner of the gate structure, wherein the first epitaxial layer physically contacts the first, second, and third sidewalls of the recess,
performing a selective etch back process to the first epitaxial layer to remove a dislocation area associated with the portion of the first epitaxial layer contacting gate corner, wherein after performing the selective etch back process to the first epitaxial layer to remove the dislocation area a remaining portion of the first epitaxial layer is positioned directly under the sidewall spacer, wherein the remaining portion of the first epitaxial layer continuously extends from the sidewall spacer to the isolation structure along the first, second, and third sidewalls of the recess, and
performing a second epitaxial growth process to form a second epitaxial layer over the first epitaxial layer that fills the recess, wherein a portion of the second epitaxial layer contacts the corner of the gate structure.

17. The method of claim 16 wherein the selective etch back process removes a <111> facet of the first epitaxial layer.

18. The method of claim 17 wherein the corner of the gate structure includes a dielectric material and the first epitaxial layer and the second epitaxial layer include n-type doped silicon.

19. The method of claim 16, wherein the first epitaxial layer includes a first <111> facet, a second <111> facet, and a <100> facet intersecting the first and second <111> facets, and
wherein the selective etch back process removes the first <111> facet, the second <111> facet, and the <100> facet.

20. The method of claim 1, further comprising forming another epitaxial layer directly on the epitaxial layer after performing the selective etch back process to remove the dislocation area.

* * * * *